United States Patent
Jeon et al.

(10) Patent No.: US 6,404,055 B1
(45) Date of Patent: Jun. 11, 2002

(54) SEMICONDUCTOR DEVICE WITH IMPROVED METAL INTERCONNECTION AND METHOD FOR FORMING THE METAL INTERCONNECTION

(75) Inventors: Jeong-sic Jeon, Seoul; Jae-woong Kim, Yongin; Sang-hee Kim, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/862,521

(22) Filed: May 23, 2001

(30) Foreign Application Priority Data

Nov. 3, 2000 (KR) ........................................ 2000-65258

(51) Int. Cl.[7] ...................... H01L 23/525; H01L 23/522
(52) U.S. Cl. ........................ 257/752; 257/750; 257/774
(58) Field of Search ............................... 257/750, 752, 257/758, 773, 774

(56) References Cited

U.S. PATENT DOCUMENTS

| | | | |
|---|---|---|---|
| 4,889,832 A | * 12/1989 | Chatterjee | ................... 438/270 |
| 5,578,523 A | 11/1996 | Fiordalice et al. | |
| 6,080,655 A | 6/2000 | Givens et al. | ............... 438/626 |
| 6,080,656 A | * 6/2000 | Shih et al. | ................... 438/626 |
| 6,080,669 A | * 6/2000 | Iaciponi et al. | ............. 438/672 |
| 6,156,651 A | * 12/2000 | Havemann | ................... 438/674 |
| 6,235,633 B1 | * 5/2001 | Jang | ........................... 438/675 |
| 6,249,055 B1 | * 6/2001 | Dubin | ........................ 257/758 |

* cited by examiner

Primary Examiner—Allan R. Wilson
(74) Attorney, Agent, or Firm—Volentine Francos, PLLC

(57) ABSTRACT

A semiconductor device having a metal interconnection structure, and a method of forming a corresponding semiconductor device having a metal interconnection. The semiconductor device includes an interlevel dielectric (ILD) film deposited over a semiconductor substrate. The semiconductor substrate includes gate electrodes thereon separated from each other by an equal distance, and includes junction areas located between the gate electrodes, and is subjected to polishing. A portion of the ILD film aligned with a gate electrode is etched to a depth to form a trench. An anti-short insulating layer is deposited on the ILD film and in the trench. The anti-short insulating layer and the ILD film are etched to form a via hole so as to expose a junction area. The trench and the via hole are filled with metal, thereby resulting in a completed metal interconnection.

17 Claims, 8 Drawing Sheets

SEMICONDUCTOR DEVICE WITH IMPROVED METAL INTERCONNECTION AND METHOD FOR FORMING THE METAL INTERCONNECTION

The present application claims priority under 35 U.S.C. §119 to Korean Application No. 2000-65258 filed on Nov. 3, 2000, which is hereby incorporated by reference in its entirety for all purposes.

BACKGROUND OF THE INVENTION

1. Field of the Invention

The present invention relates to a semiconductor device with metal interconnection and a method for forming metal interconnections of a semiconductor device, and more particularly, to a semiconductor device with double damascene metal interconnections and a method for forming the metal interconnections of a semiconductor device.

2. Description of the Related Art

With the increase in integration density of semiconductor devices, conductive layers for a semiconductor device have been deposited on a wafer with a multi-level structure. The multi-level interconnection structure contributes to reducing the cell area and design rule of the semiconductor device, thereby increasing the integration density of the semiconductor device. For multi-level interconnections having smaller size, it would be desirable to conduct extensive research and development into advanced metal interconnection structures and alternative materials used to form interconnections.

A double damascene technique has been used to form advanced interconnections. According to the double damascene technique, a trench aligned with a gate electrode and a via hole through which a selected junction area is exposed are formed, and both the trench and the via hole are filled with a conductive material by the same process. Thus, the double damascene technique is advantageous because it simplifies the entire metal interconnection process.

A structure of metal interconnection of a semiconductor device manufactured using a conventional double damascene technique is shown in FIG. 1. FIG. 2 is a plan view of the metal interconnection shown in FIG. 2. Referring to FIGS. 1 and 2, a gate insulating layer 21 and a conductive layer for forming a gate electrode is deposited in succession on a semiconductor substrate 20 having a first conductive type. A selected portion of the conductive layer is patterned into a gate electrode 23. Spacers 25 are formed on the sidewalls of the gate electrode 23 by a known technique. Impurities having a second conductive type, which is an opposite type to that of the semiconductor substrate 20, are implanted into substrate 20 on both sides of the gate electrode 23, thereby forming junction area 27.

A first interlevel dielectric (ILD) film 29 is formed over the semiconductor substrate 20 having the gate electrode 23 and the junction area 27, to a thickness of 8,000–20,000 Å. Following this, the surface of the first ILD film 29 is polished a predetermined depth by chemical mechanical polishing. A selected portion of the first ILD film 29 is patterned to form a trench T aligned with the gate electrode 23, and a via hole H through which the junction area 27 between adjacent gate electrodes is exposed. Here, a selected portion of the first IDL film 29 is removed by etching to form the trench T, such that the depth of the trench T is smaller than the depth of the via hole H.

Following this, an adhesive layer 31 is deposited along the surface of the first ILD film 29 and in the via hole H and the trench T, and a metal layer 32 is thereafter deposited on the structure to fill the via hole H and the trench T. The metal layer 32 and the adhesive layer 31 are polished by chemical mechanical polishing until the surface of the first ILD film 29 is exposed. As a result, first metal interconnections 34$a$ and 34$b$ having the metal layer 32 and the adhesive layer 31 embedded in the via hole H and the trench T are completed. In this case, since the first metal interconnection 34$b$ formed in the trench T are aligned with the gate electrode 23, a series of first metal interconnections 34$b$ are arranged in lines parallel to each other over the substrate 20, separated by a predetermined distance from each other, as shown in FIG. 2.

Next, a second ILD film 36 is deposited over the first ILD film 29 including the first metal interconnections 34$a$ and 34$b$ therein, and then the second ILD film 36 is partially etched such that the first metal interconnection 34$a$ filling the via hole H is exposed. A second metal interconnection 38 is formed over the second ILD film 29 such that the second metal interconnection 38 contacts the first metal interconnection 34$a$, which is exposed by etching. The second metal interconnection 38 is formed to be perpendicular to the first metal interconnection 34$b$ filling the trench T, as shown in FIG. 2.

However, there are problems in forming metal interconnections by the conventional double damascene technique. Chemical mechanical polishing causes aggregations of slurry that is applied as an abrasive, and polishing residues, (not shown) to remain on the polished surface of a layer. As a result, when physical force is applied through a polishing pad to polish the first ILD film 29 for example, the surface of the first ILD film 29 is scratched due to the presence of such slurry aggregations and polishing residues. Scratches on the surface of the first ILD film 29, which are caused by the slurry aggregations and polishing residues, are referred to as "microscratches". As shown in FIG. 2, microscratches 39 occur in lines in a polishing direction. The depth of the microscratches 39 vary depending on the force applied to the polishing pad and the particle size of the slurry aggregates and polishing residues. Usually, the depth of the microscratches 39 are in the range of 500–1500 Å, but if serious, can be as deep as 2000 Å.

During formation of the first metal interconnections 34$a$ and 34$b$, portions of the adhesive layer 31 and the metal layer 32 remain caught in the unnecessary microscratches formed on the first ILD film 29. As shown in FIG. 2, since the microscratches 39 occur in lines along a polishing direction, the remaining metal layer 32 serves as bridges between adjacent first metal interconnections 34$a$ and 34$b$, as shown in FIGS. 3 and 4, thereby causing a short between the first metal interconnections 34$a$ and 34$b$. As a result, failure occurs during the manufacture of semiconductor devices, thereby degrading the electrical properties of semiconductor devices.

SUMMARY OF THE INVENTION

The present invention is therefore directed to a semiconductor device with improved metal interconnection, and a method of forming the metal interconnection, which substantially overcome one or more of the problems due to the limitations and disadvantages of the related art.

To solve the above problems, it is a first object of the present invention to provide a semiconductor device with improved metal interconnections, which does not include shorts between adjacent metal interconnections.

It is a second object of the present invention to provide a method for forming metal interconnections of a semiconductor device, which is capable of preventing the occurrence of shorts between the metal interconnections formed using a double damascene technique.

The first and other objects of the present invention are achieved by a semiconductor device with an improved metal interconnection structure, including a substrate in which a plurality of conductive areas are defined, and an interlevel dielectric (ILD) film with a polished surface that covers the substrate and that has a via hole and a trench with a smaller depth than the via hole. Here, a selected conductive area is exposed through the via hole. The semiconductor device also includes a metal interconnection formed in each of the via hole and the trench, and an anti-short insulating layer formed on the sidewalls of the metal interconnection formed in the trench.

The anti-short insulating layer may be further formed on the bottom of the trench filled with the metal interconnection, and on the surface of the ILD film adjacent to the trench. The anti-short insulating layer may be formed of the same insulating layer as the ILD film, or an insulating layer having a polishing selectivity of 15:1 or greater with respect to the metal interconnection, such as a silicon nitride layer or a silicon oxynitride layer. Also, the metal interconnection may comprise a metal layer formed in the trench and in the via hole, and an adhesive layer interposed between the metal layer and the ILD film.

In another embodiment, there is provided a semiconductor device with an improved metal interconnection structure, including a substrate in which a plurality of conductive areas are defined, and an interlevel dielectric (ILD) film with a polished surface that covers the substrate and that has a via hole and a trench with a smaller depth than the via hole. Here, a selected conductive area is exposed through the via hole. The semiconductor device also includes a metal interconnection formed in each of the via hole and the trench, and an insulating spacer formed on the sidewalls of the metal interconnection formed in the trench.

The semiconductor device may further include a polishing stop layer formed on the surface of the ILD film adjacent to the trench, on the insulating spacer in the trench, and on the bottom of the trench. The polishing stop layer and the spacer may be formed of the same insulating layer. Alternatively, the polishing stop layer and the spacer may be formed of the same insulating layer as the ILD film, or the spacer may be formed of an insulating layer having a polishing selectivity of 15:1 or greater with respect to the metal interconnection.

To achieve the second and other objects of the present invention, there is provided a method for forming a metal interconnection of a semiconductor device, the method comprising preparing a semiconductor substrate in which a plurality of conductive areas are defined. An interlevel dielectric (ILD) film with a polished surface is formed over the semiconductor substrate. Next, a portion of the ILD film, below which a conductive area selected from the plurality of the conductive areas is not located, is etched a predetermined depth to form a trench. An anti-short insulating layer is formed on the ILD film and in the trench. Then, the anti-short insulating layer and the ILD film are etched to form a via hole through which the selected conductive area is exposed. Lastly, the trench and the via hole are filled with metal to form a metal interconnection.

In another embodiment, there is provided a method for forming a metal interconnection of a semiconductor device, the method comprising preparing a semiconductor substrate in which a plurality of conductive areas are defined. An interlevel dielectric (ILD) film with a polished surface is formed over the semiconductor substrate. Then, a portion of the ILD film, below which a conductive area selected from the plurality of the conductive areas is not located, is etched by a predetermined depth to form a trench. An anti-short insulating layer is formed on the ILD film and in the trench. Following this, the anti-short insulating layer is etched back such that the ILD film is exposed while the anti-short insulating layer remains as spacers only on both sidewalls of the trench. A portion of the ILD film is etched to form a via hole through which the selected conductive area is exposed. Lastly, the trench and the via hole are filled with metal to form a metal interconnection.

Forming the metal interconnection may comprise forming an adhesive layer along the ILD film and in the trench and the via hole; forming a metal layer over the adhesive layer such that the trench and the via hole are completely filled; and polishing the metal layer and the adhesive layer until the surface of the metal ILD film is exposed.

After the formation of the spacers and before the formation of the via hole, the method may further include forming a polishing stop layer over the ILD film and the spacers. In this way, the polishing stop layer may be formed of the same insulating layer as the anti-short insulating layer. For example, the anti-short insulating layer and the polishing stop layer can be formed of the same material layer as the ILD film, or an insulating layer having a polishing selectivity of 15:1 or greater with respect to the metal interconnection.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
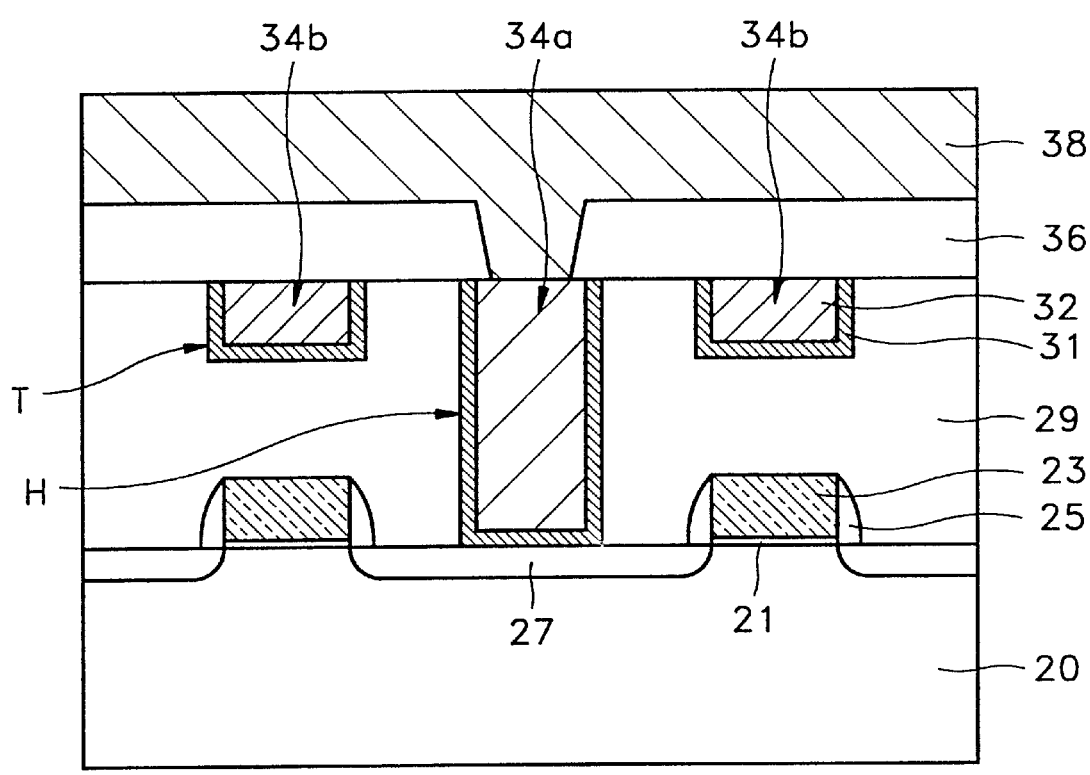
FIG. 1 is a sectional view illustrating a structure of metal interconnections of a semiconductor device formed using a conventional double damascene technique.
Figure 2:
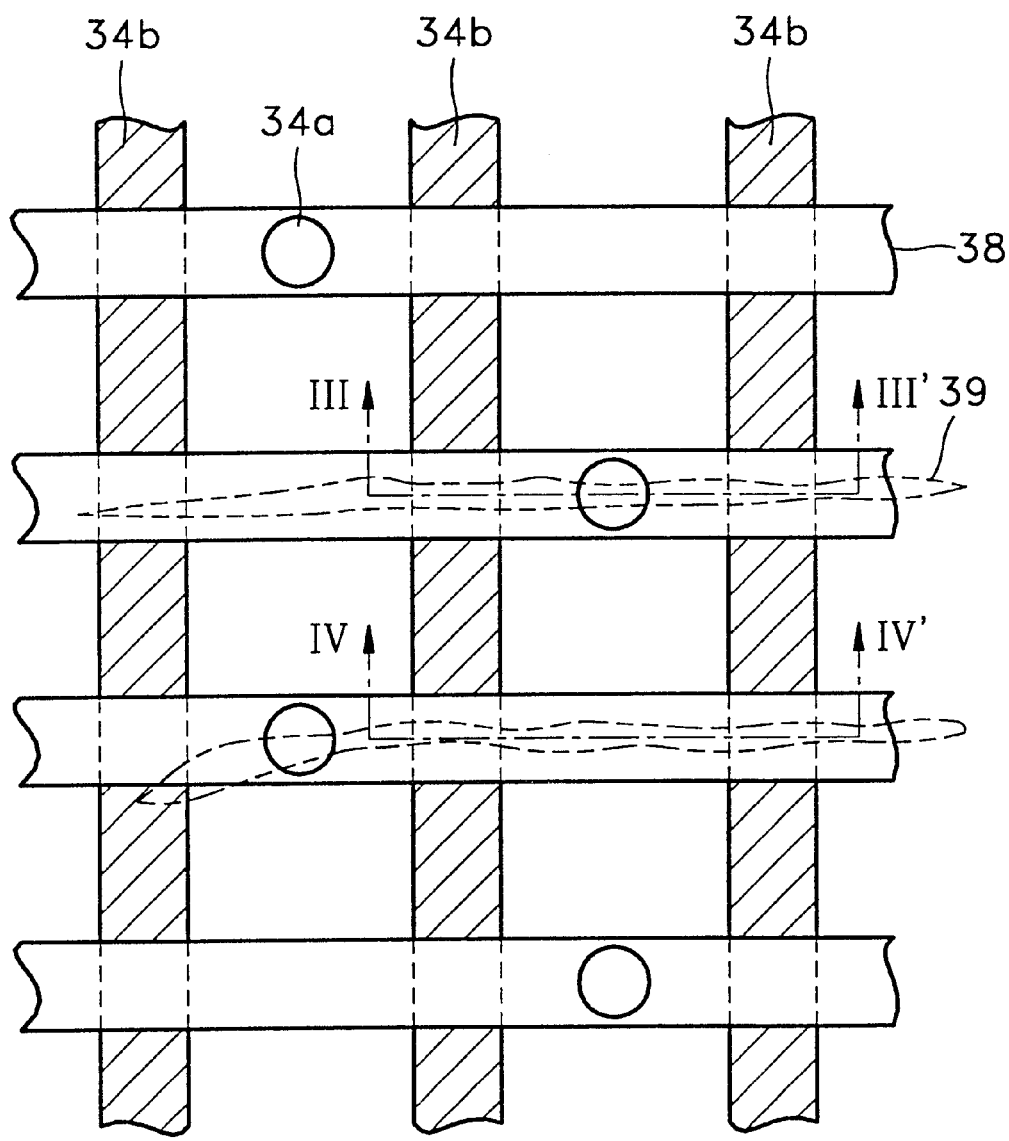
FIG. 2 is a plan view of the metal interconnections of the semiconductor device shown in FIG. 1.
Figure 3:
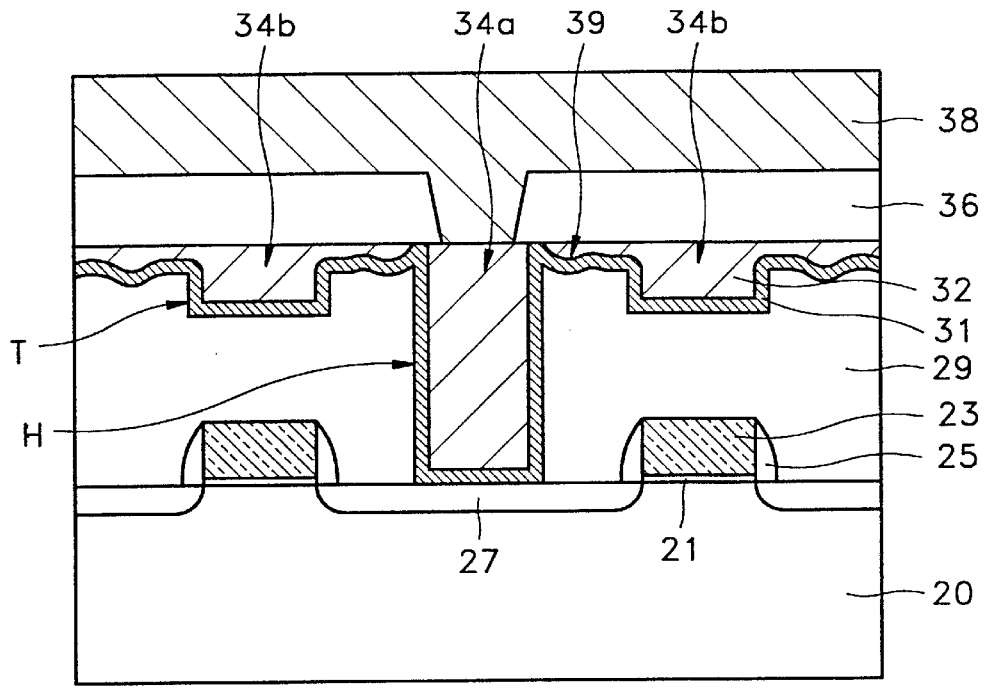
FIG. 3 is a sectional view taken along line III—III' of FIG. 2.
Figure 4:
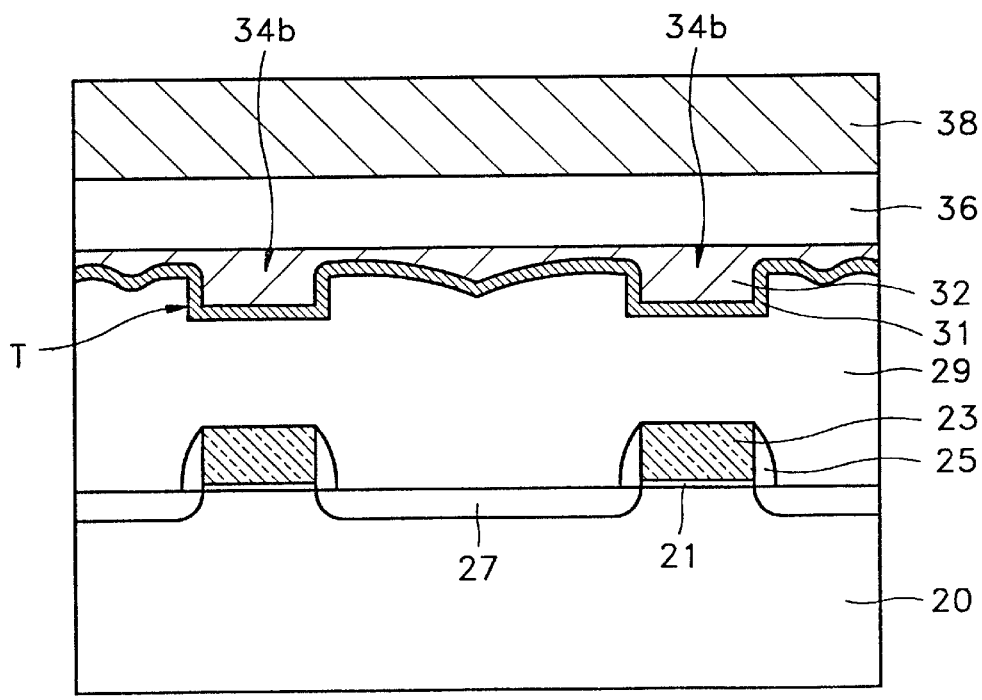
FIG. 4 is a sectional view taken along line IV—IV' of FIG. 2.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the an. In the drawings, the thickness of layers and regions are exaggerated for clarity. It is also noted that like reference numerals may be used to designate identical or corresponding parts throughout the drawings. It will also be understood that when a layer is referred to as being "on" another layer or substrate, it can be directly on the other layer or substrate, or intervening layers may also be present.

Figure 5A:
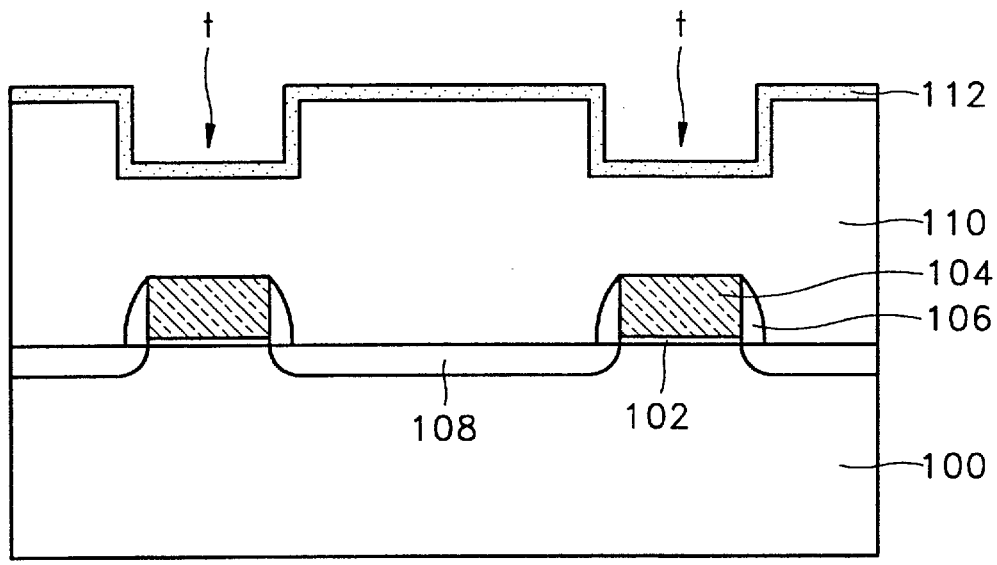
FIGS. 5A through 5D are sectional views illustrating successive stages in forming metal interconnections of a semiconductor device according to a preferred embodiment of the present invention.

A preferred embodiment of a method for forming metal interconnections of a semiconductor device will be described with reference to FIGS. 5A through 5D. Referring to FIG. 5A, a gate insulating layer 102 and a conductive layer (not shown) for forming a gate electrode are deposited in succession over a semiconductor substrate 100 having a first conductive type. The conductive layer is patterned into a gate electrode 104. Insulating spacers 106 are formed on both sides of the gate electrode 104 by a known technique. A plurality of gate electrodes 104 are arranged in lines, separated by an equal distance from each other. The gate electrode 104 may be formed of a doped polysilicon layer, a transition metal silicide layer, a transition metal layer, or a doped polysilicon/transition metal silicide layer. A capping insulating layer (not shown) may be formed on the gate electrode 104 for self-contact alignment. Impurities having a second conductive type, which is an opposite type to that of the semiconductor substrate 100, are implanted into substrate 100 at both sides of the gate electrode 104, thereby forming a junction area 108.

Following this, a first interlevel dielectric (ILD) film 110 is deposited over the semiconductor substrate 100 including the gate electrode 104 and the junction area 108, to a thickness of 8,000–20,000 Å. The first ILD film 110 may be formed as a single insulating layer, a multi-level insulating layer, or a multi-level insulating layer including a planarization layer. In order to planarize the first ILD film 110, the surface of the first ILD film 110 is polished a predetermined depth using a chemical mechanical polishing technique. During the chemical mechanical polishing, microscratches (not shown) may occur on the surface of the first ILD film 110. After the chemical mechanical polishing is completed, a photoresist pattern (not shown) is formed on the polished first ILD film, such that a portion of the first ILD film 110, which is aligned with the gate electrode 104, is exposed. The exposed portion of the first ILD film 110 is etched a predetermined depth using the photoresist pattern as a mask, thereby resulting in a trench t in the first ILD film 110. An anti-short insulating layer 112 is deposited along the first ILD film 110 with the trench t. The anti-short insulating layer 112 is deposited to have a predetermined thickness, for example, a thickness of 200–1,000 Å, wherein microscratches in the first ILD film 110 are completely covered by the anti-short insulating layer 112. Although microscratches may be as deep as 500–1,000 Å, the microscratches have very narrow width. Thus, the microscratches are fully covered with the anti-short insulating layer 112 having a thickness of 200–1,000 Å. The anti-short insulating layer 112 filling the microscratches serves to prevent a short between adjacent metal interconnections which will be formed subsequently. The anti-short insulating layer 112 may be formed of the same material as that used to form the first ILD film 110. Alternatively, the anti-short insulating layer 112 may be formed of an insulating layer having a polishing selectivity of 15:1 or greater with respect to metal interconnections. An insulating layer with this polishing selectivity may be a silicon nitride (SiN) layer or a silicon oxynitride (SiON) layer.

Figure 5B:
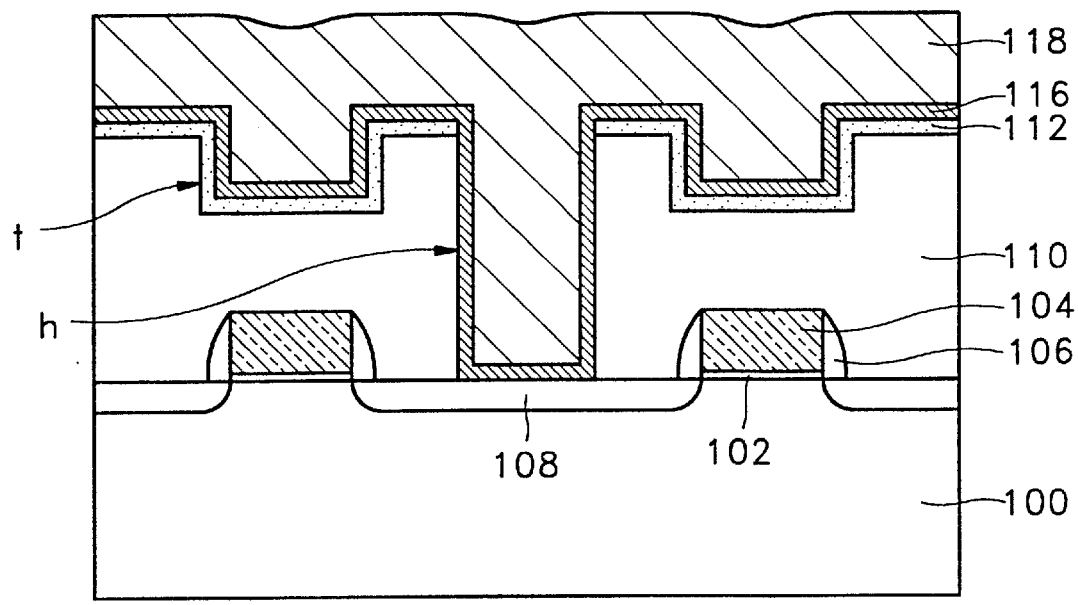

A photoresist pattern (not shown) is formed on the anti-short insulating layer 112 by a known photolithography process such that a portion of the anti-short insulating layer 112, which is aligned with the junction area 108 between adjacent gate electrodes 104, is exposed. Following this, the anti-short insulating layer 112 and the first ILD film 110 are etched using the photoresist pattern, thereby forming a via hole h through which the junction area 108 between adjacent gate electrodes 104 is exposed. Next, an adhesive layer 116 is formed on the anti-short insulating layer 112, and on the exposed first ILD film 110 and the junction area 108 within via hole h, as shown in FIG. 5B. As well known, the adhesive layer 116 may be formed of a titanium (Ti) layer or a composite layer of Ti and titanium nitride (TiN) layers. A first metal layer 118 is deposited over the adhesive layer 116. The first metal layer 118 may be formed of tungsten (W) or copper (Cu) having fluidity enough to fill the trench t and the via hole h, to have a thickness at which the trench t and the via hole h are completely filled.

Figure 5C:
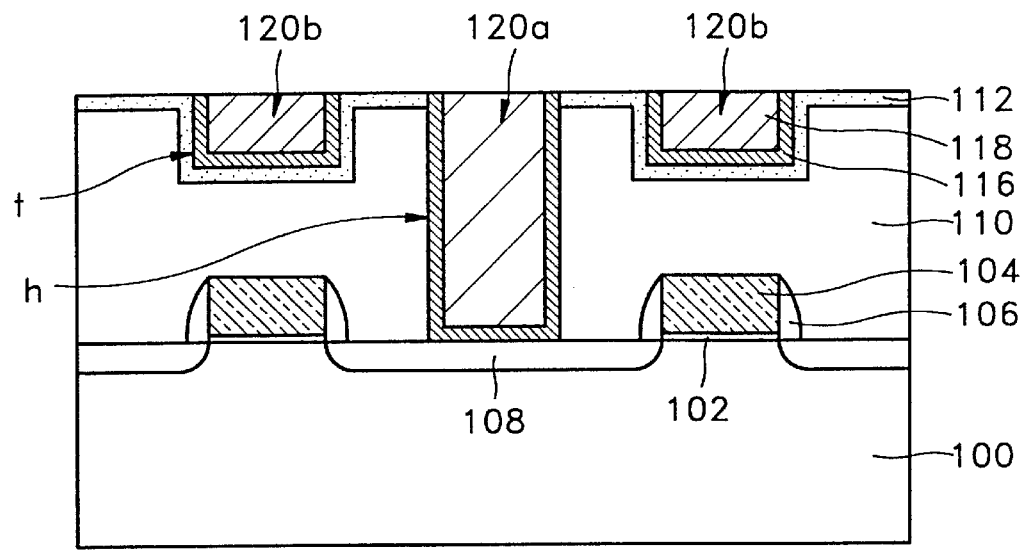

Referring to FIG. 5C, the first metal layer 118 is subjected to chemical mechanical polishing until the anti-short insulating layer 112 is exposed. As a result, first metal interconnections 120a and 120b having the metal layer 118 and the adhesive layer 116 embedded in the via hole h and the trench t are completed. In FIG. 5C, reference numeral 120a denotes a first metal interconnection filling the via hole h, and reference numeral 120b denotes a first metal interconnection filling the trench t.

Figure 5D:
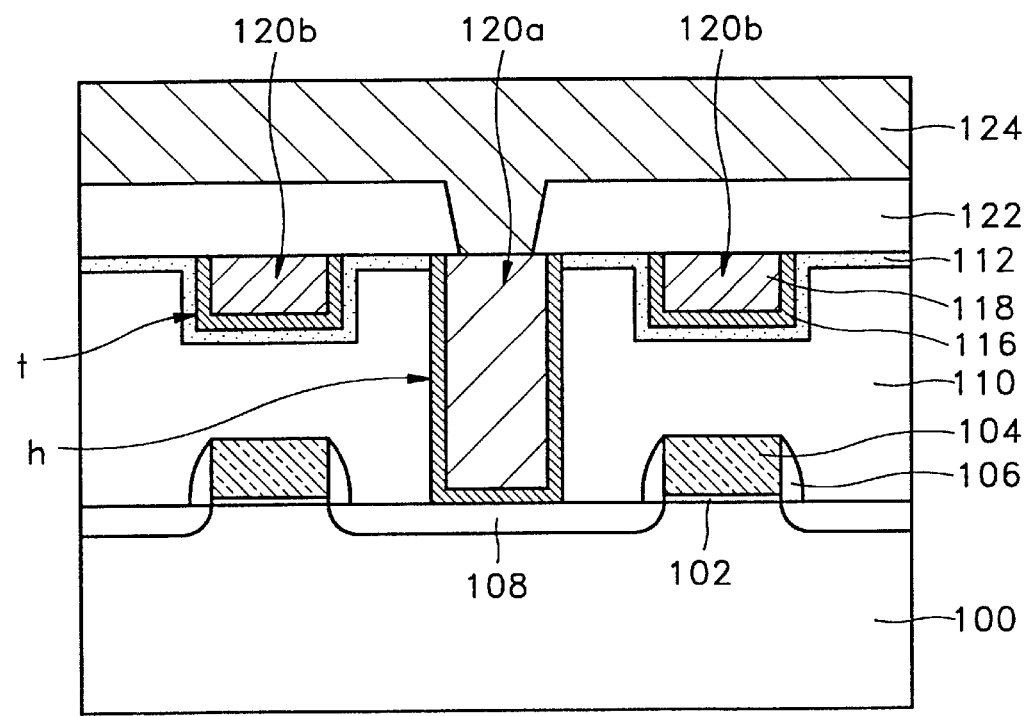

As shown in FIG. 5D, a second ILD film 122 is deposited over the first metal interconnections 120a and 120b, and the anti-short insulating layer 112, and the second ILD film 122 is etched until a portion of the first metal interconnection 120a filling the via hole h is exposed. Then, a second metal interconnection 124 is deposited over the second ILD film 122 and to be in contact with the exposed first metal interconnection 120a.

Figure 6:
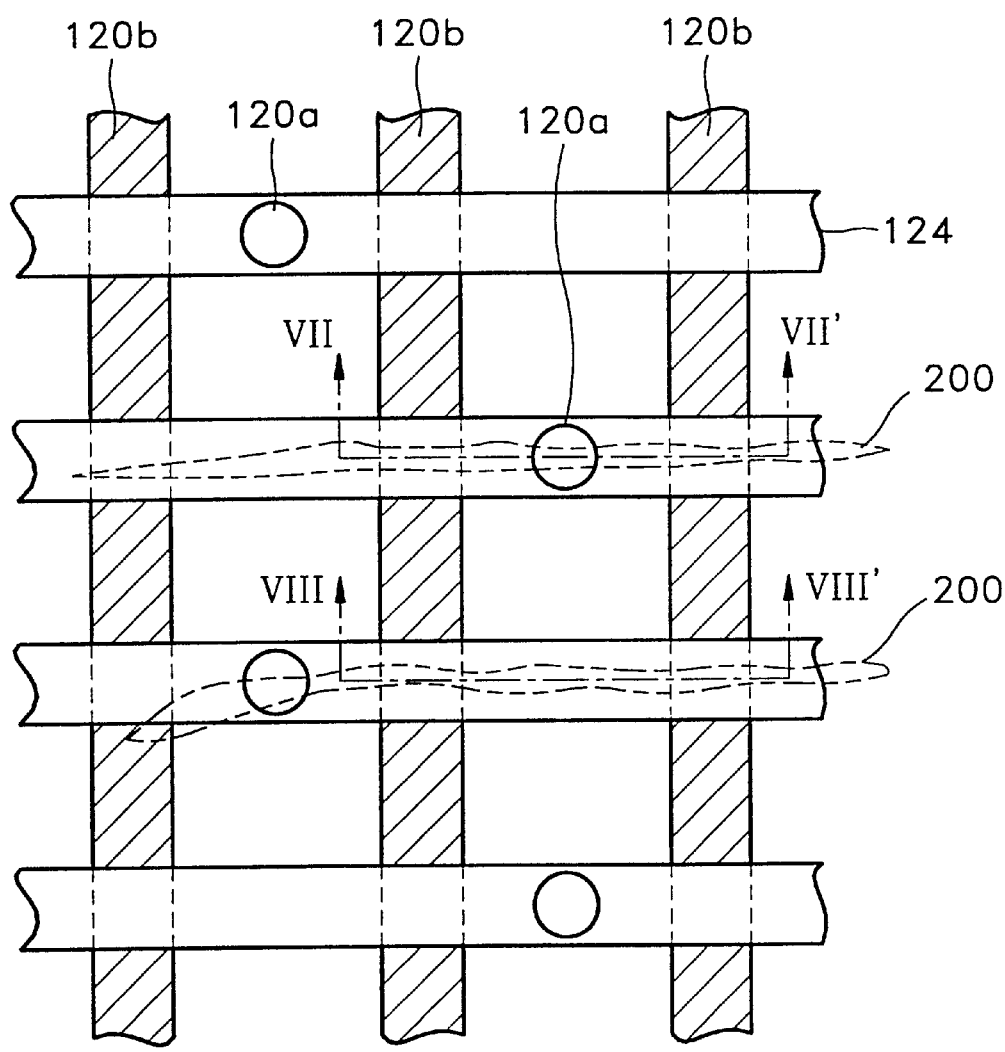
FIG. 6 is a plan view illustrating the metal interconnections of a semiconductor device formed according to the first embodiment of the present invention as illustrated in FIGS. 5A–5D.

FIG. 6 is a plan view showing the metal interconnections of the semiconductor device manufactured by the above-mention method. Referring to FIG. 6, a plurality of first metal interconnections 120b each filling a trench t are arranged in lines separated by an equal distance from each other, and a plurality of second metal interconnections 124 are arranged to be perpendicular to the first metal interconnections 120b. Although microscratches 200 occur in the first ILD film 110 in lines parallel to the second metal interconnections 124 for example, shorts between adjacent first metal interconnections 120a and 120b can be prevented by the anti-short insulating layer 112.

Figure 7:
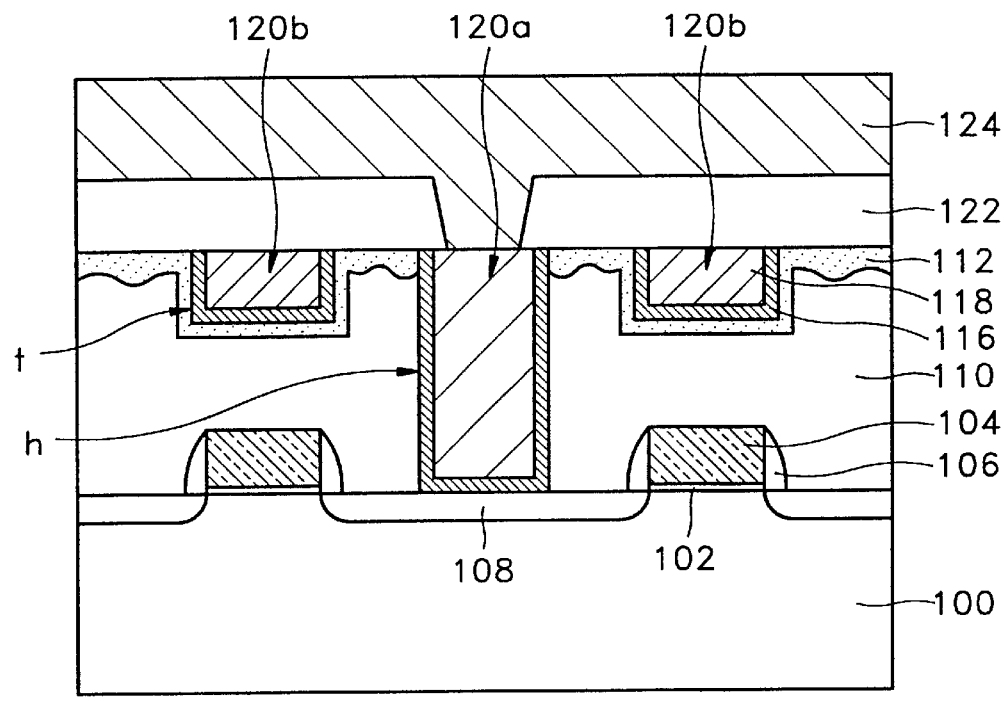
FIG. 7 is a sectional view taken along line VII—VII' of FIG. 6.
Figure 8:
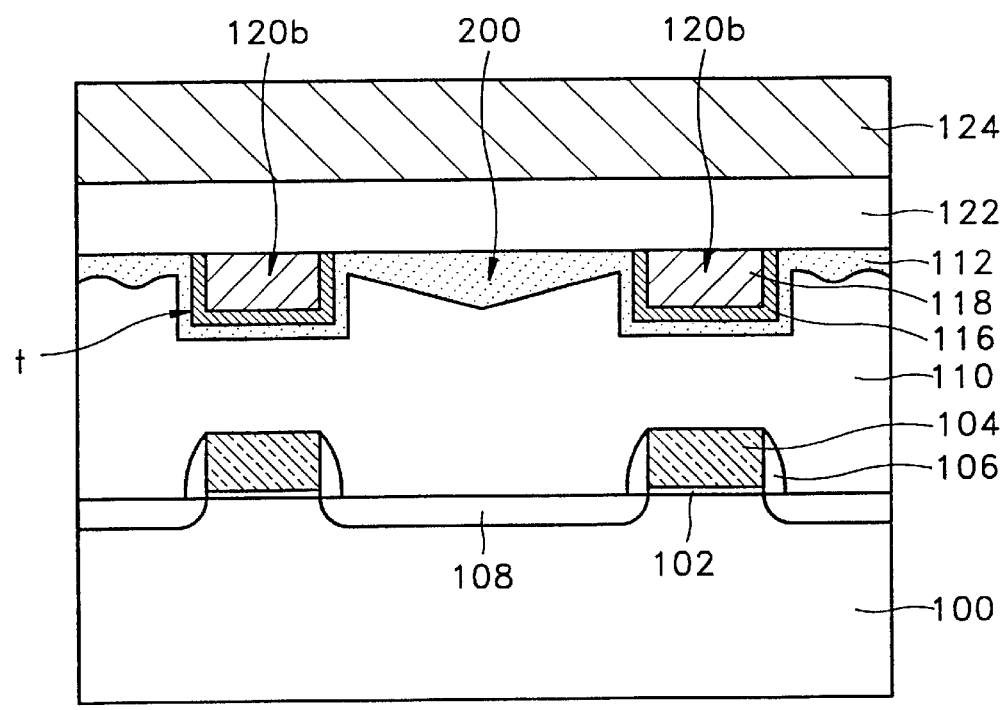
FIG. 8 is a sectional view taken along line VIII—VIII' of FIG. 6.

In particular, as shown in FIGS. 7 and 8, although microscratch 200 occurs in the first ILD film 110 during a polishing process, due to the presence of the anti-short insulating layer 112 covering microscratch 200, a short between adjacent first metal interconnections 120a and 120b can be prevented.

Figure 9:
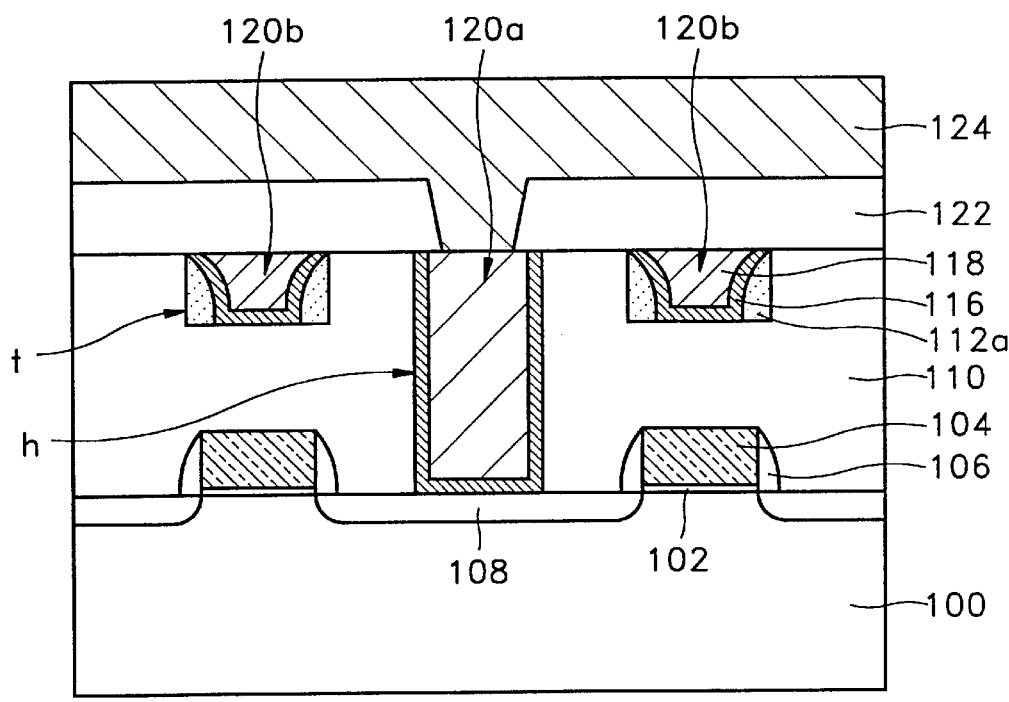
FIG. 9 is a sectional view illustrating the metal interconnections of a semiconductor device formed according to a second embodiment of the present invention.

Another embodiment of a semiconductor device having metal interconnections according to this invention is shown in FIG. 9. In this embodiment, the successive steps up to the formation of the trench t in the first ILD film 110 are the same as those in the first embodiment, and thus only processes following the formation of the trench t will be described with respect to this embodiment. The same reference elements as those of the first embodiment as described with respect to FIGS. 5–8 are represented by the same reference numerals in this embodiment.

Referring to FIG. 9, after the trench t is formed in the first ILD film 110, an anti-short insulating layer 112 (see FIG. 5) is deposited on the first ILD film 110 and in the trench t. Here, the anti-short insulating layer may be formed of the same material used in the first embodiment, i.e., the same insulating layer used to form the first ILD film 110, or an insulating layer, for example, a silicon nitride layer or a silicon oxynitride layer, having a polishing selectivity of 15:1 or greater with respect to metal interconnections to be subsequently formed. The anti-short insulating layer is etched back such that the surface of the first ILD film 110 is exposed and the anti-short insulating layer remains as spacers on the sidewalls of the trench t. Even when the surface of the first ILD film 110 is scratched, microscratches (not shown) can be covered with the anti-short insulating layer, so that the surface of the first ILD film 110 can be planarized. In FIG. 9, reference numeral 112a denotes a trench-spacer, which is the anti-short insulating layer remaining as a spacer on the sidewalls of the trench t.

Following this, in order to expose the junction area 108 between adjacent gate electrodes 104, a photoresist pattern (not shown) is formed on the first ILD film 110. The first ILD film 110 is etched using the photoresist pattern as a mask, thereby forming a via hole h through which the junction area 108 is exposed.

Following this, like in the first embodiment, the adhesive layer 116 and the first metal layer 118 are deposited in succession on the surface of the first ILD film 110, on the trench-spacer 112a and on the exposed surface of the junction area 108 within via hole h, and are then subjected to chemical mechanical polishing until the surface of the first ILD film 110 is exposed. As a result, first metal interconnections 120a and 120b having the first metal layer 118 and the adhesive layer 116 embedded in the via hole h and the trench t are completed. Next, the second ILD film 122 is formed over the first ILD film 110 and the first metal interconnections 120a and 120b, and patterned such that a portion of the first metal interconnection 120a filling the via hole h is exposed. A second metal interconnection 124 is formed over the second ILD film 120a and to be in contact with the exposed first metal interconnection 120a.

In the present embodiment, the trench-spacer 112a is formed on the sidewalls of the trench t filled with the first metal interconnection 120b, thereby isolating the first metal interconnection 120b and the remaining metal in the microscratches from each other. At this time, the first metal interconnections 120a and 120b are also isolated from each other. In addition, when the anti-short insulating layer 112 is etched back to form the trench-spacer 112a, microscratches present over the first ILD film 110 can be further covered with byproducts from the etching, thereby preventing any metal layer from adhering to the micro scratches.

Figure 10:
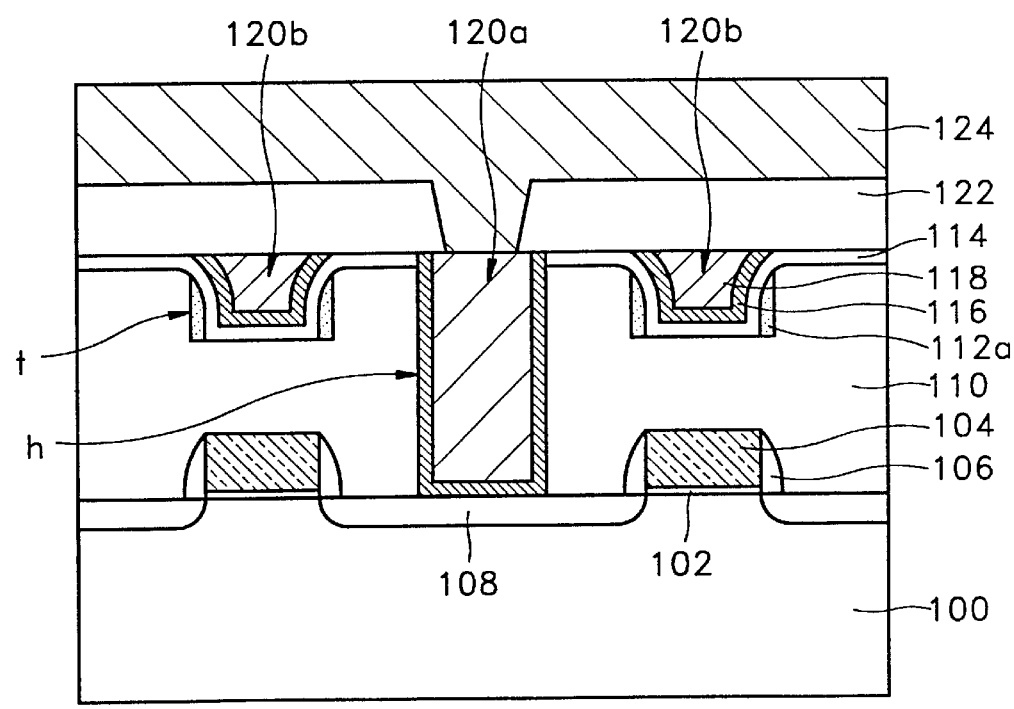
FIG. 10 is a sectional view illustrating the metal interconnections of a semiconductor device formed according to a third embodiment of the present invention.

Still another embodiment of a semiconductor device having metal interconnections according to the present invention is shown in FIG. 10. In this embodiment, the successive steps up to the formation of the trench-spacer 112a, which is an anti-short insulating layer formed on the sidewalls of the trench t, are the same as those in the second embodiment, and thus only processes following the formation of the trench-spacer 112a will be described. The same reference elements as those of the first and second embodiments are represented by the same reference numerals in this embodiment.

Referring to FIG. 10, after the trench-spacer 112a is formed on the sidewalls of the trench t, a polishing stop layer 114 is deposited along the first ILD film 110 and on the trench-spacer 112a in the trench t, to a thickness of 200–500 Å. The polishing stop layer 114 serves as a polishing stop point in forming metal interconnections by polishing. The polishing stop layer 114 may be formed of the same material used to form the first ILD film 110, or of an insulating layer such as a silicon nitride layer or a silicon oxynitride layer having a polishing selectivity of 15:1 or greater with respect to metal interconnections to be subsequently formed. Following this, the first metal interconnections 120a and 120b, the second ILD film 122, and the second metal interconnection 124 are formed by the same processes as described with respect to the first and second embodiments.

In this embodiment, since the polishing stop layer 114 is formed on the trench-spacer 112a and the first ILD film 110 using the same material used to form the first ILD film 110, or using an insulating layer having a polishing selectivity of 15:1 or greater with respect to the first metal interconnections 120a and 120b, polishing for the first metal interconnections 120a and 120b can be easily performed, resulting in the first ILD film 110 having a planarized surface. In addition, even when a metal layer remains in microscratches distributed over the first ILD film 110, the first metal interconnections 120a and 120b can be insulated from the remaining metal layer by the trench-spacer 112a and the polishing stop layer 114, thereby preventing a short between adjacent metal interconnections.

As previously mentioned, according to the present invention, in order to prevent the occurrence of shorts between adjacent metal interconnections formed using a double damascene technique, due to microscratches distributed over the ILD film, an anti-short insulating layer is deposited on the ILD film including the microscratches, before the formation of metal interconnections. The microscratches are completely covered by the anti-short insulating layer, and thus the occurrence of shorts between adjacent metal connections can be prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
    a substrate including a plurality of conductive areas therein;
    an interlevel dielectric (ILD) film having a polished surface, the ILD film covering the substrate and having a via hole through which one of the plurality of the conductive areas is exposed and having a trench with a smaller depth than the via hole;
    an anti-short insulating layer formed on sidewalls of the trench; and a metal interconnection formed in the via hole and on the anti-short insulating layer in the trench, the anti-short insulating layer also being formed on a surface of the ILD film adjacent to the trench.

2. The semiconductor device of claim 1, wherein the anti-short insulating layer is also formed on a bottom of the trench.

3. The semiconductor device of claim 1, wherein the anti-short insulating layer is a same material as the ILD film.

4. The semiconductor device of claim 1, wherein the anti-short insulating layer has a polishing selectivity of 15:1 or greater with respect to the metal interconnection.

5. The semiconductor device of claim 4, wherein the anti-short insulating layer is a silicon nitride layer or a silicon oxynitride layer.

6. The semiconductor device of claim 1, wherein the metal interconnection comprises:

an adhesive layer formed in the trench and in the via hole; and a metal layer formed on the adhesive layer in the trench and in the via hole.

7. A semiconductor device comprising;

a substrate including a plurality of conductive areas therein;

an interlevel dielectric (ILD) film having a polished surface, the ILD film covering the substrate and having a via hole through which one of the plurality of the conductive areas is exposed and having a trench with a smaller depth than the via hole:

an insulating spacer formed on sidewalls of the trench;

a metal interconnection formed in the via hole and on the insulating spacer in the trench; and a polishing stop layer formed on the surface of the ILD film adjacent to the trench, on the insulating spacer in the trench, and on a bottom of the trench, the polishing stop layer and the insulating spacer being a same insulating material.

8. The semiconductor device of claim 7, wherein the polishing stop layer and the insulating spacer are a same insulating material as the ILD film.

9. The semiconductor device of claim 7, wherein the insulating spacer is an insulating material having a polishing selectivity of 15:1 or greater with respect to the metal interconnection.

10. The semiconductor device of claim 9, wherein the insulating spacer is a silicon nitride or a silicon oxynitride layer.

11. The semiconductor device of claim 7, wherein the metal interconnection comprises:

an adhesive layer formed in the trench and on the polishing stop layer in the via hole; and a metal layer formed on the adhesive layer in the trench and in the via hole.

12. A semiconductor device comprising:

a substrate including a plurality of conductive areas therein;

an interlevel dielectric (ILD) film having a polished surface, the ILD film covering the substrate and having a via hole through which one of the plurality of the conductive areas is exposed and having a trench with a smaller depth than the via hole;

an insulating spacer formed on sidewalls of the trench;

a metal interconnection formed in the via hole and on the insulating spacer in the trench; and a polishing stop layer formed on the surface of the ILD film adjacent to the trench, on the insulating spacer in the trench, and on a bottom of the trench.

13. The semiconductor device of claim 12, wherein the polishing stop layer and the insulating spacer are a same insulating material.

14. The semiconductor device of claim 13, wherein the polishing stop layer and the insulating spacer are a same insulating material as the ILD film.

15. The semiconductor device of claim 13, wherein the insulating spacer is an insulating material having a polishing selectivity of 15:1 or greater with respect to the metal interconnection.

16. The semiconductor device of claim 15, wherein the insulating spacer is a silicon nitride layer or a silicon oxynitride layer.

17. The semiconductor device of claim 12, wherein the metal interconnection comprises:

an adhesive layer formed in the trench and on the polishing stop layer in the via hole; and a metal layer formed on the adhesive layer in the trench and in the via hole.

* * * * *